Figure 1:
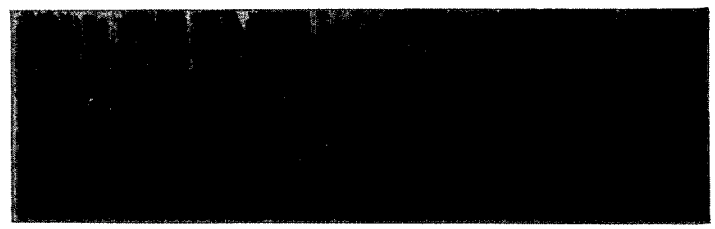

United States Patent [19]

Authier

[11] 4,382,838

[45] May 10, 1983

[54] NOVEL SILICON CRYSTALS AND PROCESS FOR THEIR PREPARATION

[75] Inventor: Bernhard Authier, Burghausen, Fed. Rep. of Germany

[73] Assignee: Wacker-Chemie GmbH, Munich, Fed. Rep. of Germany

[21] Appl. No.: 652,359

[22] Filed: Jan. 26, 1976

[30] Foreign Application Priority Data

Feb. 28, 1975 [DE] Fed. Rep. of Germany ....... 2508803

[51] Int. Cl.³ .............................................. C30B 11/14
[52] U.S. Cl. ............................... 156/616 R; 164/122.2
[58] Field of Search ............. 23/295 R, 300; 923/348; 156/624, DIG. 64, 616; 164/122, 124, 125-127, 348, 122.2; 65/66, 83, 85

[56] References Cited

U.S. PATENT DOCUMENTS

| | | | |
|---|---|---|---|
| 1,251,951 | 1/1918 | Ashdown | 164/126 |
| 2,402,582 | 6/1946 | Scaff | 23/300 |
| 2,402,839 | 6/1946 | Ohl | 148/1.5 |
| 2,821,760 | 2/1958 | Kurzinski | 164/124 |
| 3,012,865 | 12/1981 | Pellin | 156/616 |
| 3,051,555 | 8/1962 | Rummel | 23/295 |
| 3,536,121 | 10/1970 | Piearcey | 156/616 R |
| 3,567,526 | 3/1971 | Gell | 156/616 |
| 3,763,926 | 10/1973 | Tschinkel | 164/126 |
| 3,900,943 | 8/1975 | Sirtl et al. | 29/572 |

OTHER PUBLICATIONS

Transactions of the Metallurgist Society of AIME, vol. 224, 12/62, 1271-1277.

*Primary Examiner*—Hiram H. Bernstein
*Attorney, Agent, or Firm*—Allison C. Collard; Thomas M. Galgano

[57] ABSTRACT

A plate-like silicon crystal having a columnar structure formed along the direction of the shortest axis, produced by cooling molten silicon, which may contain a doping agent, in a temperature gradient between the two largest boundary surfaces of the melt, one of which has a maximum temperature of 1200° C., and the opposite surface being at least 200° to 1000° C. higher, but below the melting point of silicon.

8 Claims, 2 Drawing Figures

NOVEL SILICON CRYSTALS AND PROCESS FOR THEIR PREPARATION

The present invention relates to novel, plate-like silicon crystals and their production by casting of molten silicon in a suitable mold and then allowing the melt to solidify within a suitable temperature gradient.

With the increasing shortage and cost of fossil energy sources, greater importance is being attached to the production of energy by the direct conversion of solar energy into electrical energy by means of solar cells. While this kind of energy production is presently dominant in the field of satellite technology, its terrestrial application has been limited because of the high cost of such solar cells. Of greatest interest in this connection are silicon cells, in which approximately one-third of the cost is represented by the silicon content. A considerable reduction in the cost of the semiconductor material, on one hand, together with an additional reduction in the cost of further processing thereof to produce the solar cell, on the other hand, are prerequisites to the creation of a rational market for solar energy.

The specifications which up to now have been established for silicon for use in solar cells, are extraordinarily high. The silicon must be monocrystalline and as perfect as possible, that is, free from point defects, dislocations, twinning formations, stacking faults, "swirls" or chemical impurities. The efficiency of solar cells produced from such material varies between 10% and 12%, out of a theoretically possible 22%. Since the silicon discs must usually be cut from monocrystalline bars of the above quality by diamond saws, about half of the bar is lost as waste. In order to avoid this loss, the aim at present is to utilize monocrystalline silicon ribbons, as obtained by the EDFG ("edge defined film fed growth") process of Tyco Company, as a base material, for which an efficiency of about 10% is to be expected in solar cells. From the standpoint of cost, polycrystalline silicon would be of interest. However, solar cells made with polycrystalline silicon have up to now been prepared with an efficiency of only 1%, which is of no economic interest, cf. Electronics, Apr. 4, 1974, page 109.

The object of the present invention is therefore to produce inexpensive silicon crystals, the crystal habit of which is plate-like to the greatest extent possible, which are suitable as a base material for the manufacture of solar cells.

In accordance with the present invention there is provided a novel plate-like silicon crystal, which exhibits semiconductor properties, and has a specific crystallographic preferential orientation, and method of producing the same.

The plate-like silicon crystals produced in accordance with the method of the invention exhibit a columnar structure, formed along the direction of the shortest axis from monocrystalline zones having a crystallographic preferential orientation.

A method of producing plate-like silicon crystals of specific crystal orientation has now been found by pouring a mass of molten silicon into a suitable mold and subsequently letting it solidify in a temperature gradient, this method being characterized in that, after the mass of molten silicon has been poured into an appropriately shaped casting mold, at least one of the two largest boundary surfaces of the melt which lie opposite one another, is in contact with one surface of the casting mold, one contact face with the molten mass having a maximum temperature of 1200° C., while the opposite boundary surface of the melt is exposed to a temperature which is at least higher by 200° to 1000° C., but which is below the melting point of silicon or, during contact with a further surface of the casting mold, below a maximum of 1200° C.

The silicon which is introduced into the mold in accordance with the invention may be melted down in a suitable crucible, e.g. one made of quartz, under vacuum or a blanket of inert gas, and the melt poured into a suitable mold for the production of the plate-like bodies, for which purpose the temperature of the silicon melt is advantageously between about 1450° and about 1600° C. during pouring.

For casting, there are employed principally open or closed molds. In the preferred embodiment of the method, the molten silicon is poured into a pan-shaped ingot mold open at the top, the bottom surface being in contact with one of the two largest boundary surfaces of the introduced molten mass, said mold surface being kept at a maximum temperature of 1200° C., preferably between about 600° and 1000° C., for example, by means of a metal plate having a cooling liquid flowing therethrough, while at the opposite free upper surface of the melt there is applied a temperature which is at least 200° to 1000° C., and preferably 200° to 800° C. above that at the cooled base surface of the casting mold, but below the melting point of silicon, said elevated temperature being applied, for example, by radiant heat, such as by the presence of a correspondingly heated graphite plate, thereby establishing the desired temperature gradient. If the radiant heat is produced by an appropriately heated graphite plate, it has proved to be advantageous to heat the graphite plate, which is advantageously positioned above the upper surface of the melt, to about 1400° to 1550° C.

In order to avoid wetting of the mold, it is desirable, moreover, to keep the lateral faces adjacent the major surfaces of the melt, at a temperature below 1200° C., while, on the other hand, the temperature should nevertheless be sufficiently above that of the cooled major surface of the melt, to limit directional growth of the solidifying silicon crystals from the lateral faces inwards as much as possible, although narrow edge regions are encountered thereby only in the case of the larger plates. The preferred temperature of the lateral faces is therefore 1100° C. to exactly 1200° C.

As material for the casting mold there may be employed, for example, silicon nitride, preparations of mold material from silicon dioxide and silicon nitride or graphite, or preferably graphite itself.

In accordance with another variation of the method of the invention, there is employed a casting mold which is in contact with both of the two largest boundary surfaces of the melt, advantageously in such a manner that these surfaces are disposed vertically, and the silicon melt is poured into the slot formed thereby. With this casting mold embodiment, which is likewise preferably made of graphite, the hotter contact surface of the mold with the melt should also exhibit a temperature below 1200° C., to avoid wetting with the melt. If the temperature of this contact surface is, for example, held at exactly 1200° C., it is advisable to cool the other contact face to 200° C. to 1000° C., preferably 400° C. to 800° C., as the temperature drops between both contact faces, according to the invention, is to be 200° C. to 1000° C. For the lateral faces there is employed a tempering corresponding to the control of extensively open molds.

Basically, culture with seed crystals is also possible, the cooled contact surface of the casting mold with the melt being loaded prior to the introduction of the silicon melt with a plate-like silicon crystal having the desired crystallographic specification. In accordance with another variation, using an open mold, a mass of molten silicon is gradually or continuously added to the mold from above, one of the largest boundary surfaces of the melt being in contact with one surface of the casting mold, namely the cooled surface so that the presently solidified silicon bottom layer determines the growth conditions for the subsequently poured-in-melt with reference to a preferred crystalline orientation, and the plate-like silicon crystals according to the invention grow to form bars or rods. The temperature control is hereby advantageously adjusted within the limits of the invention by suitable mechanical or electronic programming. If, for example, the upper surface of the silicon melt to which additions are being run in, is adjusted by means of suitable radiation sources to a temperature of about 1400° C., then the original base surface of the casting mold, because of the growth of the silicon bars, must be cooled more and more intensely, in order to establish a temperature at the solidification front, which comes into contact with the subsequently poured silicon melt, of 400° C. to a maximum of 1200° C., in accordance with the invention. The tempering of the lateral faces of the mold must be regulated correspondingly, whereby the zones at a given time in contact with liquid silicon melt are maintained at a temperature preferably between 1100° C. to exactly 1200° C.

Doped silicon crystals can also be separated in accordance with the invention. In order to obtain silicon crystals having a particular doping, the silicon melt, prior to its introduction into the casting mold, is enriched with an appropriate doping agent, examples of which include boron, aluminum, gallium, indium, arsenic, antimony or phosphorus. The particular crystal orientation required, according to the invention, for the production of plate-like silicon crystals, can be achieved by suitable adjustment of temperature parameters, for plate-like crystals of other semiconductor substances, such as, for example, germanium, gallium arsenide or gallium phosphide, which have the property of expansion during solidification.

The plate-like silicon crystals produced according to the method of the invention exhibit a columnar structure formed in the direction of the shortest axis from monocrystalline crystal zones having a preferential crystallographic orientation, and have semiconductor properties. If doping agents are added to the melt before its introduction into the casting mold they are distributed extraordinarily homogeneously in the silicon without radial or axial gradients.

In order to utilize such silicon crystals as a base material in the semiconductor industry, especially for electronic components, there is advantageously added to the melt, a sufficient amount of the doping agent to impart to the silicon crystals a content of from $5 \times 10^{14}$ to $15 \times 10^{18}$ atoms of doping agent per cubic centimeter.

The plate-like silicon crystals of the invention are characterized by long life of minority carriers. As a basic material for solar cells they offer the possibility of a considerable cost reduction. With an obtainable efficiency of over 10%, they are at least equivalent to most of the monocrystalline materials available heretofore, but with considerably lower production costs. The efficiency may be still further increased by special surface etching, since for example, crystal zones grown in 100-direction are more strongly attacked by etching on the outer surface than the other zones. Such specifically roughened surfaces have at least partially the activity of black cells with considerably stronger light absorption and consequently increased efficiency.

The following examples serve to illustrate the practice of the invention, but are not be be regarded as limiting.

EXAMPLE 1

1000 g of very pure, polycrystalline silicon, which had been doped with $2 \times 10^{15}$ atoms of boron, were melted in a quartz crucible, heated to 1500° C., and poured into a casting mold.

The casting mold consisted of a cylindrical graphite block of 200 mm diameter, from which the mold shape hole of $100 \times 100 \times 70$ mm had been cut out. Prior to the introduction of the silicon melt, this casting mold was heated up by means of an inductively heated radiation tube made of graphite, but at the same time the floor of the mold was cooled by means of a water-cooled copper plate, so that the bottom surface, i.e. a surface coming into contact with one of the largest boundary surfaces of the melt, was at a temperature of approximately 800° C. The free upper surface of the poured silicon melt was, on the other hand, exposed to the heat radiated from a graphite plate heated to 1500° C. held at a distance of about 2 cm. above the melt upper surface.

Under these thermal conditions, the silicon melt solidified, without wetting the graphite mold, to a plate, which—in order not to induce any thermal stresses—was cooled down slowly, in the course of several hours, to room temperature.

The plate-like silicon crystal thus produced exhibited a columnar structure perpendicular to the largest surface, i.e. in the direction of the shortest axis, and comprising monocrystalline crystalline zones.

In order to illustrate the structure of the novel silicon crystals made according to the invention, solar cells, as obtained in accordance with Example 1, are cut open in the direction of the shortest axis and cauterized, whereby the columnar structure of the monocrystalline zones with preferred crystallographic orientation became apparent.

For that purpose, a cross-sectional plane 500 $\mu$m high was treated for 5 minutes with a polishing etching bath consisting of 1 part by weight of hydrofluoric acid of 40%
1 part by weight of acetic acid of 96%
1 part by weight of nitric acid of 65%.

The specimen was then treated for another 5 minutes with a special etching bath to exhibit structure; this bath consisted of 1 part by weight of chromium oxide
2 parts by weight of water, diluted it 40% hydrofluoric acid in the ratio 1:1. By this treatment the columnar structure specified above was clearly visible.

Figure 2:
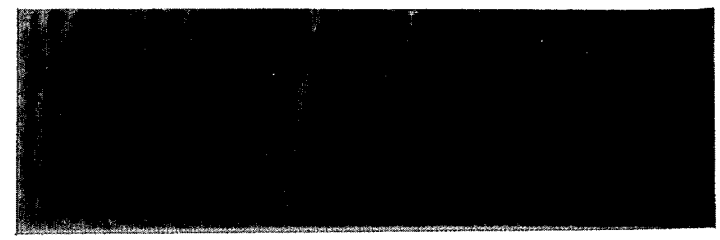

The accompanying FIGS. 1 and 2 show the structure after the second treatment.

In order to produce solar cells, slices having a thickness of approximately 500 $\mu$m were cut from this plate with diamond saws customarily used in semiconductor technology. The slices thus obtained exhibited a columnar structure aligned perpendicular to the disc surface formed from monocrystalline zones. Solar cells made from these slices in accordance with known methods had an efficiency of 10% to 11%.

EXAMPLE 2

20 g of high purity polycrystalline silicon doped with $2 \times 10^{15}$ atoms of boron, was melted, heated to 1550° C., and poured into a casting mold.

The casting mold consisted of a graphite block having a cross-section of 150×150 mm and a height of 200 mm. The graphite block was cut into two parts in the middle, along its longitudinal axis, so that one part contained a slot-like cut-out of the geometric shape of the silicon slice to be cast. The two parts were screwed together with graphite screws, so that the smooth face of the second graphite part sealed off the slot-like cut-out. At the upper end the slot was widened out to a funnel shaped opening for pouring in the melt.

While the molten mass was poured in, the two portions of the casting mold were kept at two different temperatures, so that a temperature gradient was formed between the two largest opposed faces of the slot. The temperature of one face was thus about 400° C. and that of the opposite face was approximately 1100° C. Under these conditions, the melt solidified in a columnar structure having monocrystalline zones aligned generally parallel to the temperature gradient.

After cooling, the small silicon plate—without having wetted the graphite mold—was readily removed from the mold. A thin layer of the side of the silicon platelet located on the hot side during solidification was removed by etching. Solar cells produced according to known methods from the small silicon plate had an efficiency of 8% to 10%.

It will be obvious to those skilled in the art that other changes and variations can be made in carrying out the present invention without departing from the spirit and scope thereof as defined in the appended claims.

What is claimed is:

1. A method for producing a solar cell base material consisting essentially of a silicon crystal which is plate-like and semiconductive, having a columnar structure formed in the direction of the shortest axis of the plate-like silicon crystal, from monocrystalline zones having a preferential crystallographic orientation, comprising the steps of:

pouring a mass of molten silicon into an appropriately-shaped casting mold so that at least one of the two largest boundary surfaces of the melt which lie opposite one another is in contact with a surface of the casting mold, said molten mass being introduced into said mold under the influence of a specific temperature gradient by maintaining said surface of the mold at a maximum temperature of 1200° C., while exposing the opposite boundary surface of the melt to a temperature which is at least 200° C. to 1000° C. higher than the temperature of said surface of the casting mold but below the melting point of silicon, so that the melt slowly cools down and solidifies under the influence of said temperature gradient to form a cast product; and removing said cast product from the mold.

2. The method of claim 1 in which the silicon melt is in contact with a further mold surface having a temperature of 1200° C. or below.

3. The method of claim 1 in which said casting mold is made of graphite.

4. The method of claim 1 in which the temperature of the body of molten silicon while being poured into the casting mold is between about 1450° C. and 1600° C.

5. The method of claim 1 in which a doping agent is added to the silicon melt prior to introduction into said mold.

6. The method of claim 1, wherein said one of the two largest boundary surfaces of the melt and said opposite boundary surface thereof constitute a top surface and a bottom surface respectively and wherein said melt solidifies upwardly from said bottom surface to said top surface thereof.

7. The method according to claim 1, additionally including the step of dividing said cast product into a multiplicity of plates.

8. A method for producing a solar cell base material consisting essentially of a silicon crystal which is plate-like and semiconductive, having a columnar structure formed in the direction of the shortest axis of the plate-like silicon crystal, from monocrystalline zones having a preferential crystallographic orientation, comprising the steps of:

pouring a mass of molten silicon into an appropriately-shaped casting mold so that at least one of the two largest boundary surfaces of the melt which lie opposite one another is in contact with a surface of the casting mold, said molten mass being introduced into said mold under the influence of a specific temperature gradient by maintaining said surface of the mold at a maximum temperature of 1200° C., while exposing the opposite boundary surface of the melt to a temperature which is at least 200° C. to 1000° C. higher that the temperature of said surface of the casting mold but below the melting point of silicon, so that the melt slowly cools down and solidifies under the influence of said temperature gradient to form a columnar structure extending from surface to surface, formed from monocrystalline zones having a preferential crystallographic orientation, and removing said cast product from the mold.

* * * * *

UNITED STATES PATENT AND TRADEMARK OFFICE
CERTIFICATE OF CORRECTION

PATENT NO. : 4,382,838

DATED : MAY 10, 1983

INVENTOR(S) : BERNHARD AUTHIER

It is certified that error appears in the above—identified patent and that said Letters Patent is hereby corrected as shown below:

Cover page, Identification of Assignee [73], change "Wacker-Chemie GmbH" to --Wacker-Chemitronic Gesellschaft für Elektronik-Grundstoffe mbH--.

*Signed and Sealed this*

*Twenty-seventh* Day of *December 1983*

[SEAL]

*Attest:*

GERALD J. MOSSINGHOFF

*Attesting Officer*   *Commissioner of Patents and Trademarks*